(12) United States Patent
Yeom

(10) Patent No.: US 10,879,569 B2
(45) Date of Patent: Dec. 29, 2020

(54) BATTERY PACK AND VEHICLE CONNECTED TO BATTERY PACK

(71) Applicant: Samsung SDI Co., Ltd., Yongin-si (KR)

(72) Inventor: Gilchoun Yeom, Yongin-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 198 days.

(21) Appl. No.: 16/080,555

(22) PCT Filed: Nov. 6, 2017

(86) PCT No.: PCT/KR2017/012474
§ 371 (c)(1),
(2) Date: Aug. 28, 2018

(87) PCT Pub. No.: WO2018/139741
PCT Pub. Date: Aug. 2, 2018

(65) Prior Publication Data
US 2019/0020073 A1 Jan. 17, 2019

(30) Foreign Application Priority Data
Jan. 24, 2017 (KR) .......................... 10-2017-0011179

(51) Int. Cl.
*H01M 10/42* (2006.01)
*B60R 16/04* (2006.01)
(Continued)

(52) U.S. Cl.
CPC ........... *H01M 10/425* (2013.01); *B60R 16/04* (2013.01); *H01M 2/206* (2013.01); *H01M 2/348* (2013.01);
(Continued)

(58) Field of Classification Search
CPC ......... H01M 10/425; H01M 2200/103; H01M 10/482; H01M 2/348; H01M 2010/4271; B60R 16/04; H02H 7/18; H02H 1/0007
(Continued)

(56) References Cited

U.S. PATENT DOCUMENTS

| 7,518,341 B2 | 4/2009 | Wang et al. |
| 9,112,216 B2 * | 8/2015 | Park ...................... H01M 2/206 |

(Continued)

FOREIGN PATENT DOCUMENTS

| CN | 102325670 A | 1/2012 |
| CN | 102460191 A | 5/2012 |

(Continued)

OTHER PUBLICATIONS

Extended European Search Report for corresponding European Patent Application No. 17893780.1, dated Sep. 28, 2020, 9 pages.
(Continued)

*Primary Examiner* — Sun J Lin
(74) *Attorney, Agent, or Firm* — Lewis Roca Rothgerber Christie LLP

(57) ABSTRACT

Disclosed is a battery pack connected to a host system, the battery pack including: a relay connected between a battery terminal of the battery pack and the host system; at least two battery modules, each of which includes a plurality of serially connected cells and generates battery detection information; and a battery management system (BMS), which measures a voltage of the battery terminal when a current having a predetermined value or larger flows in a high current path between the battery pack and the host system, receives at least two pieces of battery detection information from the at least two battery modules, respectively, and determines a coupling state of the battery pack based on the voltage of the battery terminal and the at least two pieces of battery detection information.

23 Claims, 6 Drawing Sheets

(51) Int. Cl.
  *H02H 7/18* (2006.01)
  *H02H 1/00* (2006.01)
  *H01M 10/48* (2006.01)
  *H01M 2/34* (2006.01)
  *H01M 2/20* (2006.01)

(52) U.S. Cl.
  CPC ......... *H01M 10/42* (2013.01); *H01M 10/482* (2013.01); *H02H 1/0007* (2013.01); *H02H 7/18* (2013.01); *H01M 2010/4271* (2013.01); *H01M 2200/103* (2013.01); *H01M 2220/20* (2013.01)

(58) Field of Classification Search
  USPC .......................................... 320/112
  See application file for complete search history.

(56) References Cited

U.S. PATENT DOCUMENTS

| | | | |
|---|---|---|---|
| 10,044,021 B2 * | 8/2018 | Jung | ............... H02J 7/0031 |
| 2010/0265051 A1 | 10/2010 | Sivertsen | |
| 2011/0285538 A1 | 11/2011 | Lee et al. | |
| 2012/0025769 A1 | 2/2012 | Kikuchi et al. | |
| 2012/0280692 A1 | 11/2012 | Park | |
| 2013/0245970 A1 | 9/2013 | Zhang | |
| 2014/0159670 A1 | 6/2014 | Lee et al. | |
| 2015/0303446 A1 | 10/2015 | Jung | |

FOREIGN PATENT DOCUMENTS

| | | |
|---|---|---|
| CN | 103283062 A | 9/2013 |
| CN | 103308860 A | 9/2013 |
| CN | 103863126 A | 6/2014 |
| CN | 104981922 A | 10/2015 |
| EP | 2 412 581 A1 | 2/2012 |
| JP | 2003-40050 A | 2/2003 |
| KR | 10-2011-0100863 A | 9/2011 |
| KR | 10-2012-0080315 A | 7/2012 |
| KR | 10-2014-0074569 A | 6/2014 |

OTHER PUBLICATIONS

Chinese Office Action dated Nov. 13, 2020, issued in corresponding Chinese Patent Application No. 201780022328.5 (10 pages).

* cited by examiner

BATTERY PACK AND VEHICLE CONNECTED TO BATTERY PACK

CROSS-REFERENCE TO RELATED APPLICATION(S)

This application is a National Phase Patent Application of International Patent Application Number PCT/KR2017/012474, filed on Nov. 6, 2017, which claims priority of Korean Patent Application No. 10-2017-0011179, filed Jan. 24, 2017. The entire contents of both of which are incorporated herein by reference.

TECHNICAL FIELD

The present disclosure relates to a battery pack, and a vehicle connected with the battery pack.

BACKGROUND ART

In the related art, it is impossible to detect a connection state of a power path, in which a high current flows, in a battery pack. The power path, in which a high current flows, includes a bus bar within a battery module, wires between battery modules, wires between a battery pack and a load, and the like.

A screw or a bolt for fastening the bus bars or the bus bar and the wire in the power path may be loosened or contact resistance may increase due to worn wires. In this state, when a high current flows, high-temperature heat is generated due to increased contact resistance, and a secondary accident (melting, fire, and the like) may be incurred due to the high-temperature heat.

DISCLOSURE

Technical Problem

The present invention has been made in an effort to provide a battery pack, which is capable of detecting high-temperature heat generated due to an increase in contact resistance in a high-current path in advance, and inducing an operation to stop by transmitting a warning message to a host system, thereby preventing a secondary accident due to the generation of the high-temperature heat, and a vehicle connected to the battery pack.

Technical Solution

An exemplary embodiment of the present invention provides a battery pack connected to a host system, the battery pack including: a relay connected between a battery terminal of the battery pack and the host system; at least two battery modules, each of which includes a plurality of serially connected cells and generates battery detection information; and a battery management system (BMS), which measures a voltage of the battery terminal when a current having a predetermined value or larger flows in a high current path between the battery pack and the host system, receives at least two pieces of battery detection information from the at least two battery modules, respectively, and determines a coupling state of the battery pack based on the voltage of the battery terminal and the at least two pieces of battery detection information.

The BMS may divide a difference between a battery pack voltage based on a voltage sum of voltages of the plurality of cells of one of the at least two battery modules and the voltage of the battery terminal by the current having the predetermined value or larger and calculate resistance.

One of the at least two battery modules may be a battery module adjacent to the BMS between the at least two battery modules, and the resistance may correspond to a sum of resistance of a terminal, a bus bar, a fuse, and a wire connected between the BMS and one of the at least two battery modules.

When the resistance has a predetermined threshold value or larger, the BMS may determine that there is abnormality in the coupling state between one of the at least two battery modules and the BMS.

The BMS may divide a difference between the highest voltage and the lowest voltage between at least two battery pack voltages based on a voltage sum of voltages of the plurality of cells of each of the at least two battery modules by the current having the predetermined value or larger and calculate resistance.

The resistance may correspond to a sum of resistance of a terminal, a bus bar, and a fuse of each of the at least two battery modules and a sum of resistance of wires between the at least two battery modules.

When the resistance has the predetermined threshold value or larger, the BMS may determine that there is abnormality in a coupling state between the at least two battery modules.

When battery module voltages at both ends of each of the at least two battery modules are smaller than a corresponding predetermined normal range, the BMS may determine that there is abnormality in a coupling state of a battery module, which has the voltage smaller than the normal range.

The normal range may be different according to a resistance value considered in each of the at least two battery modules. As the resistance value considered in each of the at least two battery modules is smaller, a corresponding normal range may be high.

When there is abnormality in the coupling state, the BMS may switch the relay to be off and the BMS may become off. The BMS may notify the host system of the abnormality of the coupling state.

Another exemplary embodiment of the present invention provides a vehicle, including: a load receiving power from a battery pack; and a vehicle control unit which stops an operation of a vehicle when receiving abnormality of a coupling state from the battery pack. The battery pack may include: a relay connected between a battery terminal and the load; at least two battery modules, each of which includes a plurality of serially connected cells and generates battery detection information; and a battery management system (BMS), which measures a voltage of the battery terminal when a current having a predetermined value or larger flows between the battery pack and the load, receives at least two pieces of battery detection information from the at least two battery modules, respectively, and determines a coupling state of the battery pack based on the voltage of the battery terminal and the at least two pieces of battery detection information.

The BMS may divide a difference between a voltage of the battery pack based on a voltage sum of voltages of the plurality of cells of one of the at least two battery modules and the voltage of the battery terminal by the current having the predetermined value or larger and calculate resistance, and when the resistance has the predetermined threshold value or larger, the BMS may determine that there is abnormality in a coupling state between one of the at least two battery modules and the BMS.

One of the at least two battery modules may be a battery module adjacent to the BMS between the at least two battery modules, and the resistance may correspond to a sum of resistance of a terminal, a bus bar, a fuse, and a wire connected between the BMS and one of the at least two battery modules.

The BMS may divide a difference between the highest voltage and the lowest voltage between at least two battery pack voltages based on a voltage sum of voltages of the plurality of cells of each of the at least two battery modules by the current having the predetermined value or larger and calculate resistance, and when the resistance has the predetermined threshold value or larger, the BMS may determine that there is abnormality in a coupling state between the at least two battery modules.

The resistance may correspond to a sum of resistance of a terminal, a bus bar, and a fuse of each of the at least two battery modules and a sum of resistance of wires between the at least two battery modules.

When battery module voltages at both ends of each of the at least two battery modules are smaller than a corresponding predetermined normal range, the BMS may determine that there is abnormality in a coupling state of a battery module, which has the voltage smaller than the normal range.

The normal range may be different according to a resistance value considered in each of the at least two battery modules.

When there is abnormality in the coupling state, the BMS may switch the relay to be off and the BMS may become off.

Advantageous Effects

According to the exemplary embodiments of the present invention, it is possible to provide the battery pack, which is capable of detecting high-temperature heat generated due to an increase in contact resistance in a high-current path in advance, and inducing an operation to stop by transmitting a warning message to a host system, thereby preventing a secondary accident due to the generation of the high-temperature heat, and the vehicle connected to the battery pack.

MODE FOR INVENTION

Figure 1:
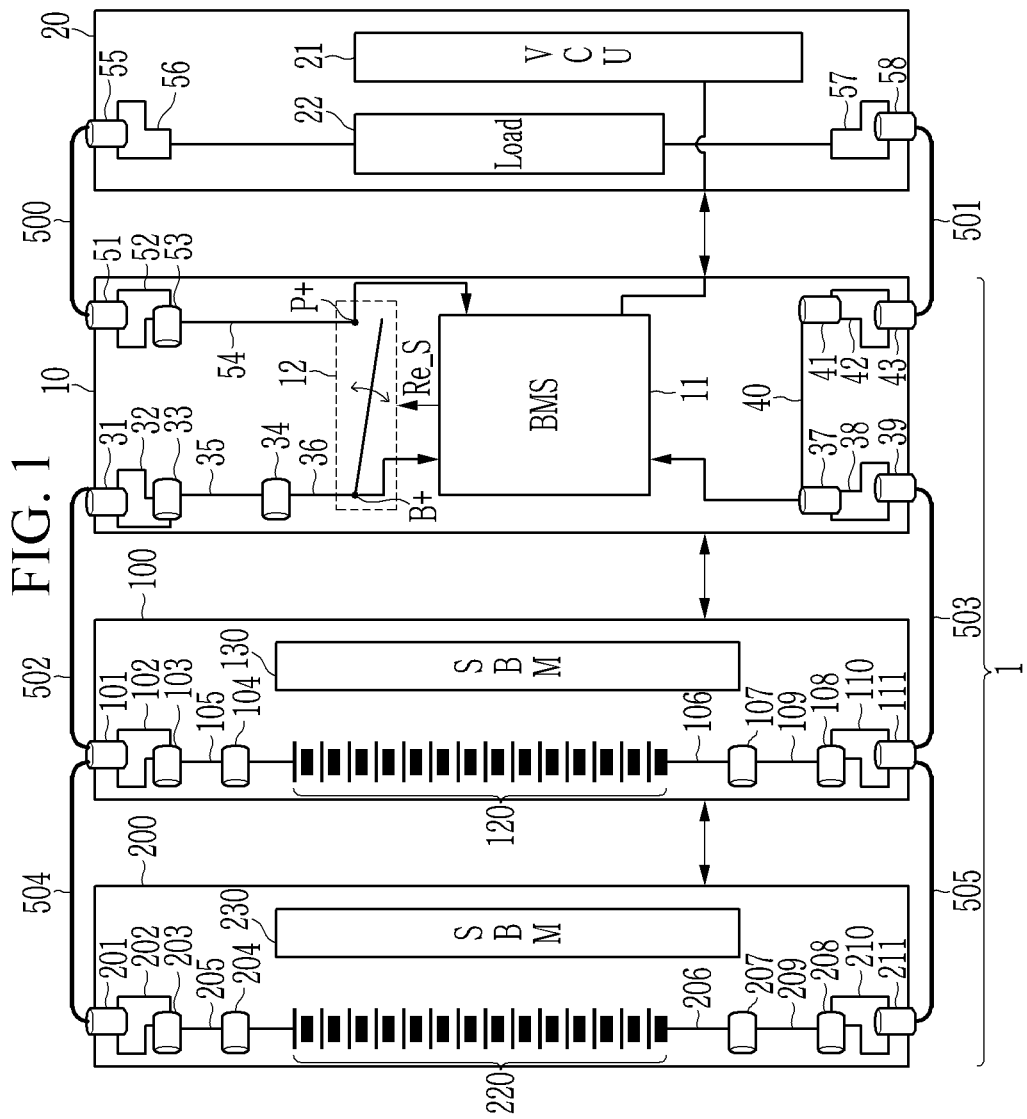
FIG. 1 is a diagram illustrating a battery pack and a part of configurations of a vehicle connected with the battery pack according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. Unless explicitly described to the contrary, the word "comprise" and variations such as "comprises" or "comprising", will be understood to imply the inclusion of stated elements but not the exclusion of any other elements.

FIG. 1 is a diagram illustrating a battery pack and a part of a configuration of a vehicle connected with the battery pack according to an exemplary embodiment.

As illustrated in FIG. 1, a battery pack 1 includes two battery modules 100 and 200, and a master module 10. The battery module 100, the battery module 200, and the master module 10 are electrically connected in parallel, and the master module 10 is connected to a vehicle 20.

The vehicle 20 is an example of a system coupled with the battery pack 1, and the present invention is not limited thereto. The vehicle 20 includes a vehicle control unit (VCU) 21 and a load 22. The load 22 may be electrically connected to the battery pack 1, and is supplied with power from the battery pack 1. The VCU 21 controls an operation of the vehicle 20.

Positive (+) terminals 102 and 202 of the battery module 100 and the battery module 200 are connected to one corresponding end between both ends of a wire 504 by bolts 101 and 201, respectively, and negative (−) terminals 110 and 210 of the battery module 100 and the battery module 200 are connected to one corresponding end between both ends of a wire 505 by bolts 111 and 211, respectively.

The positive (+) terminal 102 of the battery module 100 and a terminal 32 of the master module 10 are connected to one corresponding end between both ends of a wire 502 by bolts 101 and 31, the negative (−) terminal 110 of the battery module 100 and a terminal 38 of the master module 10 are connected to one corresponding end between both ends of a wire 503 by bolts 111 and 39.

A terminal 52 of the master module 10 and a terminal 56 of the vehicle 20 are connected to one corresponding end between both ends of a wire 500 by bolts 51 and 55, and a terminal 42 of the master module 10 and a terminal 57 of the vehicle 20 are connected to one corresponding end between both ends of the wire 500 by bolts 43 and 58.

The battery module 100 includes a plurality of serially connected cells 120 and a slave battery management unit (SBM) 130. The SBM 130 may detect a current flowing in the battery module 100, a cell voltage of each of the plurality of cells 120, a temperature of the battery module 100, voltages of both ends of the battery module 100, and the like, and generate battery detection information. The SBM 130 may transmit the battery detection information to the master module 10, receive a signal from the master module 10, and generate battery detection information according to the signal received from the master module 10.

For example, when the SBM 130 receives an instruction signal instructing to detect a battery pack voltage from the master module 10, the SBM 130 measures a voltage of each of the plurality of cells 120, and then calculates the battery pack voltage by adding the measured voltage of each of the plurality of cells 120, and transmits the calculated battery pack voltage to the master module 10.

In the battery module 100, the bus bar 105 is connected between the terminal 102 and the plurality of cells 120 by a bolt 103 and a bolt 104, and the bus bar 106 includes one end connected to the plurality of cells 120 and the other end connected to one end of the fuse 109 by a bolt 107. The fuse 109 is connected between a terminal 110 and the bus bar 106 by a bolt 107 and a bolt 108.

The battery module 200 includes a plurality of serially connected cells 220 and a slave battery management unit (SBM) 230. The SBM 230 may detect a current flowing in the battery module 200, a cell voltage of each of the plurality of cells 220, a temperature of the battery module 200, voltages of both ends of the battery module 200, and the like, and generate battery detection information.

The SBM 230 may transmit the battery detection information to the master module 10, receive a signal from the master module 10, and generate battery detection information according to the signal received from the master module 10. The SBM 230 may directly transceive a signal with the master module 10 or transceive a signal with the master module 10 through the SBM 130.

For example, when the SBM 230 receives an instruction signal instructing to detect a battery pack voltage from the master module 10, the SBM 230 measures a voltage of each of the plurality of cells 220, and then calculates the battery pack voltage by adding the measured voltage of each of the plurality of cells 220, and transmits the calculated battery pack voltage to the master module 10.

In the battery module 200, a bus bar 205 is connected between the terminal 202 and the plurality of cells 220 by a bolt 203 and a bolt 204, and the bus bar 206 includes one end connected to the plurality of cells 220 and the other end connected to one end of a fuse 209 by a bolt 207. The fuse 209 is connected between a terminal 210 and the bus bar 206 by a bolt 207 and a bolt 208.

In the master module 10, a fuse 35 is connected between a terminal 32 and one end of a bus bar 36 by a bolt 33 and a bolt 34, and the other end of the bus bar 36 is connected to a B+ terminal of the battery. In the master module 10, a bus bar 40 is connected between a terminal 38 and a terminal 42 by a bolt 37 and a bolt 41, and one end of the bus bar 54 is connected to a terminal 52 by a bolt 53 and the other end of the bus bar 54 is connected to a P+ terminal.

A relay 12 is connected between the B+ terminal and the P+ terminal, and is switched according to a relay signal Re_S output from the BMS 11. When the relay 12 is on, the B+ terminal of the battery pack 1 and the vehicle 20 are electrically connected. The BMS 11 may switch the relay 12 to be on for charging or discharging the battery pack 1, and may switch the relay 12 to be off for protecting the battery pack 1.

The BMS 11 may measure a voltage V_B+ of the B+ terminal, receive the battery detection information from the SBMs 130 and 230, and detect a coupling state of the battery pack 1 based on the voltage V_B+ of the B+ terminal and the battery detection information. The coupling state means a coupling state of the wire, the terminal, the fuse, the bus bar, and the like of the battery pack 1. When abnormality of the coupling state is detected, the BMS 11 switches the relay 12 to be off, and the BMS 11 is also off. The BMS 11 may notify the vehicle 20, which is a host system, of the abnormality of the coupling state. Particularly, the BMS 11 may notify the VCU 21 of the vehicle 20 of the abnormality of the coupling state, and the VCU 21 may stop the operation of the vehicle 20 and display the abnormality of the coupling state.

A method of detecting the coupling state by the BMS 11 will be described with reference to FIG. 2.

Figure 2:
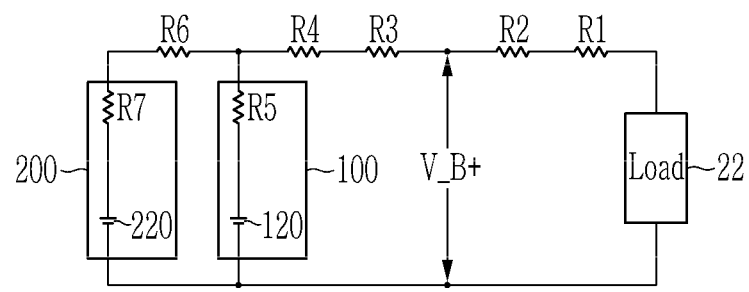
FIG. 2 is a circuit diagram illustrating an equivalent circuit of the battery pack and a load of the vehicle illustrated in FIG. 1.

FIG. 2 is a circuit diagram illustrating an equivalent circuit of the battery pack and the load of the vehicle illustrated in FIG. 1.

In FIG. 2, resistance R1 is resistance of a sum of resistance of the wires 500 and 501, resistance R2 is resistance of a sum of resistance of the terminals 42 and 52 and the bus bar 54, resistance R3 is resistance of a sum of resistance of the terminals 32 and 38, the fuse 35, and the bus bar 36, resistance R4 is resistance of a sum of resistance of the wires 502 and 503, resistance R5 is resistance of a sum of resistance of the terminals 102 and 110, the fuse 109, and the bus bars 105 and 106, resistance R6 is resistance of a sum of resistance of the wires 504 and 505, and resistance R7 is resistance of a sum of resistance of the terminals 202 and 210, the fuse 209, and the bus bars 205 and 206.

The BMS 11 uses a difference between the battery pack voltage and the voltage V_B+ of the B+ terminal for calculating the resistance R3 and R4. For example, the battery pack voltage may be a voltage obtained by summing the cell voltage of each of the plurality of cells 120 of the battery module 100.

However, the present invention is not limited thereto, and the battery pack voltage may be a higher voltage, a lower voltage, or an average of the two voltage sums between a voltage sum of the voltages of the plurality of cells of the battery module 100 and a voltage sum of the voltages of the plurality of cells of the battery module 200.

Further, the battery pack voltage is discriminated from the voltages of both ends of the battery module. The voltages of the both ends of the battery module are differences in a voltage between the positive (+) terminals and the negative (−) terminals in the battery module.

When the current flowing in the battery pack 1 is equal to or larger than a predetermined value, the BMS 11 calculates the resistance R3 and the resistance R4. Hereinafter, the current is referred to as a first current. The BMS 11 calculates resistance sum of the resistance R3 and the resistance R4 by subtracting the voltage V_B+ of the B+ terminal from the battery pack voltage and dividing the result of the subtracting by the first current. When the calculated resistance sum is equal to or larger than a predetermined first threshold value, the BMS 11 determines that there is abnormality in the coupling state among the wire, the bus bar, and the terminal corresponding to the resistance R3 and the resistance R4.

Further, in order to calculate block resistance representing the resistance R5 to R7, the BMS 11 uses a difference between the highest voltage and the lowest voltage in the battery pack voltages. When the current flowing in the battery pack 1 is equal to or larger than a predetermined value, the BMS 11 calculates the block resistance representing the resistance R5 to R7. Hereinafter, the current is referred to as a second current.

For example, the BMS 11 subtracts a lower voltage from a higher voltage in the battery pack voltages of the two battery modules 100 and 200. The BMS 11 calculates the block resistance by dividing the difference between the two voltages by the second current, and when the calculated block resistance is equal to or larger than a predetermined second threshold value, the BMS 11 determines that there is abnormality in the coupling state among the wire, the bus bar, and the terminal corresponding to the resistance R5 to R7.

FIG. 1 illustrates the battery pack including the two battery modules, but the present invention is not limited thereto.

Figure 3:
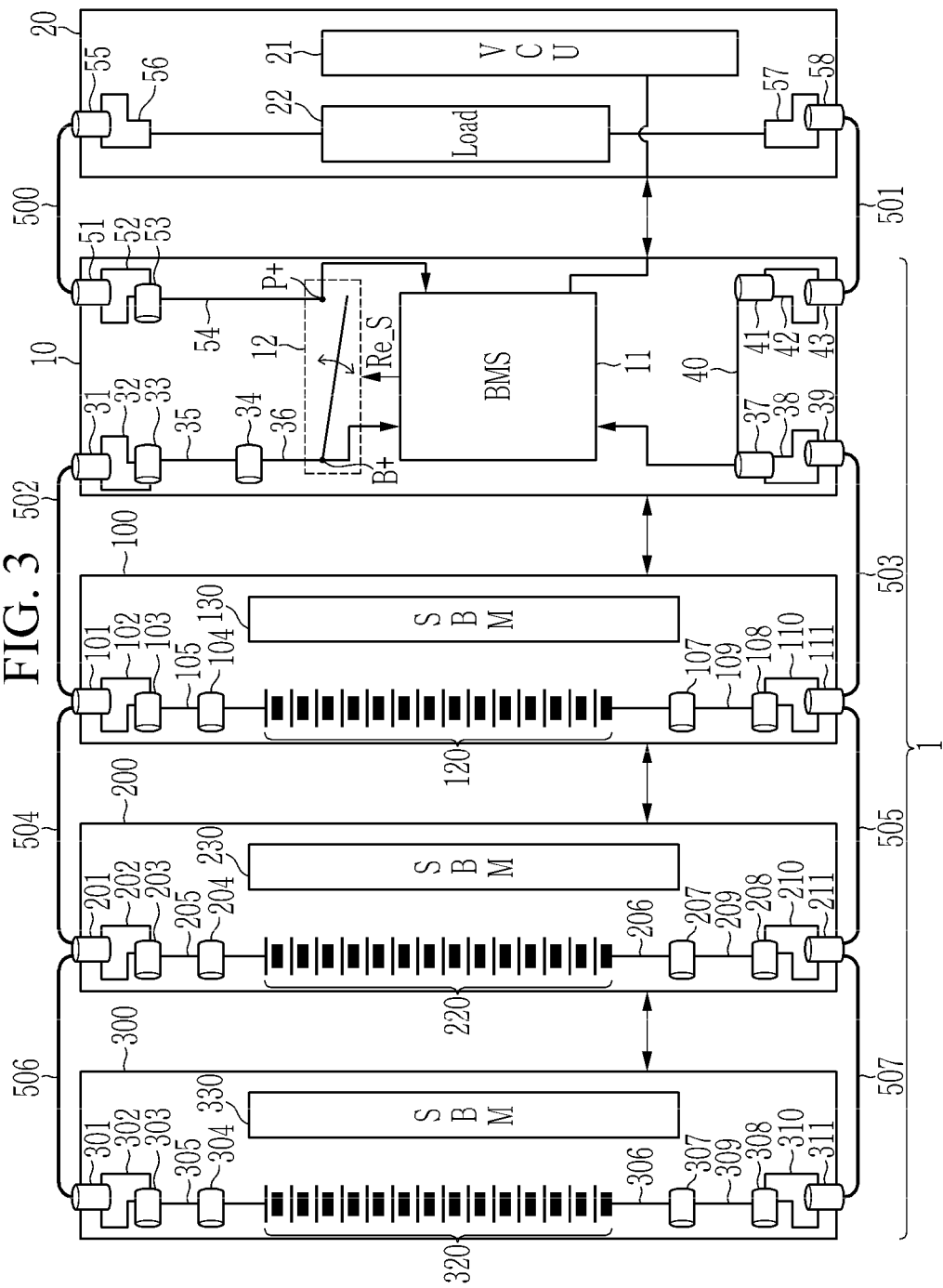
FIG. 3 is a diagram illustrating a part of configurations of a vehicle connected to a battery pack according to another exemplary embodiment.

FIG. 3 is a diagram illustrating a part of configurations of a vehicle connected to a battery pack according to another exemplary embodiment.

As illustrated in FIG. 3, a battery pack 1 includes three battery modules 100, 200, and 300. Hereinafter, overlapping descriptions to that of the foregoing exemplary embodiment will be omitted.

Positive (+) terminals 202 and 302 of the battery module 200 and the battery module 300 are coupled to one corresponding end between both ends of a wire 506 by bolts 202 and 301, and negative (−) terminals 210 and 310 of the battery module 200 and the battery module 300 are coupled to one corresponding end between both ends of a wire 507 by bolts 211 and 311.

The battery module 300 includes a plurality of serially connected cells 320 and an SBM 330. The SBM 330 may detect a current flowing in the battery module 300, a cell voltage of each of the plurality of cells 320, a temperature of the battery module 300, voltages of both ends of the battery module 300, and the like, and generate battery detection information. The SBM 330 may transmit the battery detection information to a master module 10, receive a signal from the master module 10, and generate battery detection information according to the signal received from the master module 10.

For example, when the SBM 330 receives an instruction signal instructing to detect a battery pack voltage from the master module 10, the SBM 330 measures a voltage of each of the plurality of cells 320, and then calculates the battery pack voltage by adding the measured voltage of each of the plurality of cells 320, and transmits the calculated battery pack voltage to the master module 10.

The SBM 330 may directly transceive a signal with the master module 10 or transceive a signal with the master module 10 through at least one of the two SBMs 130 and 230.

Figure 4:
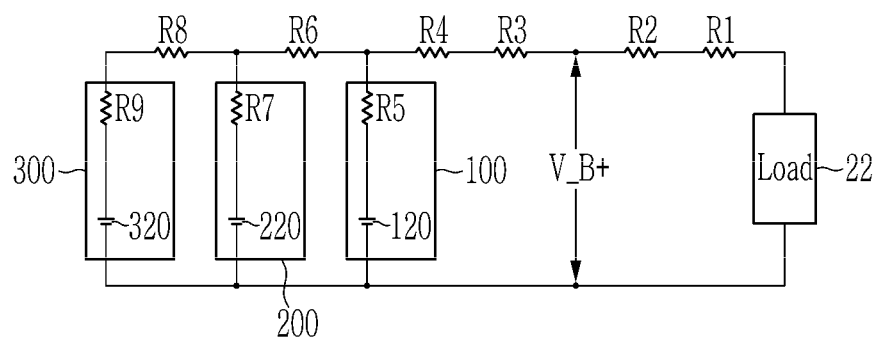
FIG. 4 is a circuit diagram illustrating an equivalent circuit of the battery pack and a load of the vehicle illustrated in FIG. 3.

FIG. 4 is a circuit diagram illustrating an equivalent circuit of the battery pack and a load of the vehicle illustrated in FIG. 3.

In FIG. 4, descriptions of resistance R1 to R7 overlap, thereby being omitted. Resistance R8 is a sum of resistance of the wires 506 and 507, and resistance R9 is a sum of resistance of the terminals 302 and 310, a fuse 309, and bus bars 305 and 306.

A scheme of calculating, by the BMS 11, a resistance sum of the resistance R3 and the resistance R4 is the same as that described above, so that the description thereof will be omitted.

In order to calculate block resistance representing the resistance R5 to R9, the BMS 11 uses a difference between the highest voltage and the lowest voltage in the battery pack voltages. When a current flowing in the battery pack 1 is equal to or larger than a predetermined value, the BMS 11 calculates the block resistance representing the resistance R5 to R9. Hereinafter, the current is referred to as a third current.

For example, the BMS 11 subtracts the lowest voltage from the highest voltage in the battery pack voltages of the three battery modules 100, 200 and 300. The BMS 11 calculates the block resistance by dividing the difference between the two voltages by the third current, and when the calculated block resistance is equal to or larger than a predetermined third threshold value, the BMS 11 determines that there is abnormality in the coupling state among the wire, the bus bar, the fuse, and the terminal corresponding to the resistance R5 to R9. The second threshold value may be larger than the third threshold value.

Further, in another exemplary embodiment, the BMS 11 determine the coupling state of the wire, the terminals, and the bus bars divided into the resistance R5, the resistance R6 and R7, and the resistance R8 and R9, respectively.

When a principle of superposition is applied based on the equivalent circuit illustrated in FIG. 4, resistance considered in each of the battery modules 100, 200, and 300 is different, so that a current flowing in each of the battery modules 100, 200, and 300 is different. In this case, it is assumed that the voltages of the battery modules 100, 200, and 300 are the same.

For example, resistance RE1 considered in the battery module 100, resistance RE2 considered in the battery module 200, and resistance RE3 considered in the battery module 300 are different from one another, and RE3>RE2>RE1. Accordingly, a current IB1 flowing in the battery module 100, a current IB2 flowing in the battery module 200, and a current IB3 flowing in the battery module 300 are different from one another, and IB1>IB2>IB3.

It is possible to estimate normal ranges for the voltage of both ends of each of the battery modules 100, 200, and 300. The normal range means the voltages of the both ends of the battery module when each of the battery modules 100, 200, and 300 has no abnormality in a coupling state with another adjacent configuration.

For example, as a resistance value considered in each of the battery modules 100, 200, and 300 is smaller, a flowing current increases, so that the voltages of both ends of each of the battery modules 100, 200, and 300 may be high. Accordingly, as the resistance value considered in each of the battery modules 100, 200, and 300 is smaller, the corresponding normal range may be high.

However, when there is a problem in the coupling state, the voltages of both ends of the battery module may be lower than the normal range. For example, when abnormality is generated in the coupling of the wire, the terminal, the bus bar, the fuse, and the like, resistance of the corresponding configuration increases. Then, a current flowing in the battery module connected through a point, at which the resistance increases, is decreased. Accordingly, the voltages of both ends of the battery module decrease.

The BMS 11 according to another exemplary embodiment receives information on the voltages of both ends of the battery module from the SBMs 130, 230, and 330 of the three battery modules 100, 200, and 300, and compares the information with the normal range of each of the battery modules, and detects the battery module, in which the voltages of both ends of the battery module are lower than the normal range. Then, the BMS 11 may determine that there is abnormality in the coupling state of the battery module, of which the voltages of both ends are not included in the normal range.

For example, when the voltages of both ends of the battery module 300 are lower than the normal range and the voltages of both ends of the battery module 200 are within the normal range, the BMS 11 determines that a resistance sum of the resistance R8 and the resistance R9 has a larger value than that of a normal state. Then, the BMS 11 may determine that there is abnormality in the coupling state among the wires 506 and 507, the terminals 302 and 310, the bus bars 305 and 306, and the fuse 309.

When the block resistance representing the resistances R5 to R9 is equal to or larger than the third threshold value, the BMS 11 may compare the voltages of both ends of each of the battery modules 100, 200, and 300 with the corresponding normal range and detect a point, at which the coupling state has abnormality.

FIG. 3 illustrates the battery pack including the three battery modules, but the present invention is not limited thereto.

Figure 5:
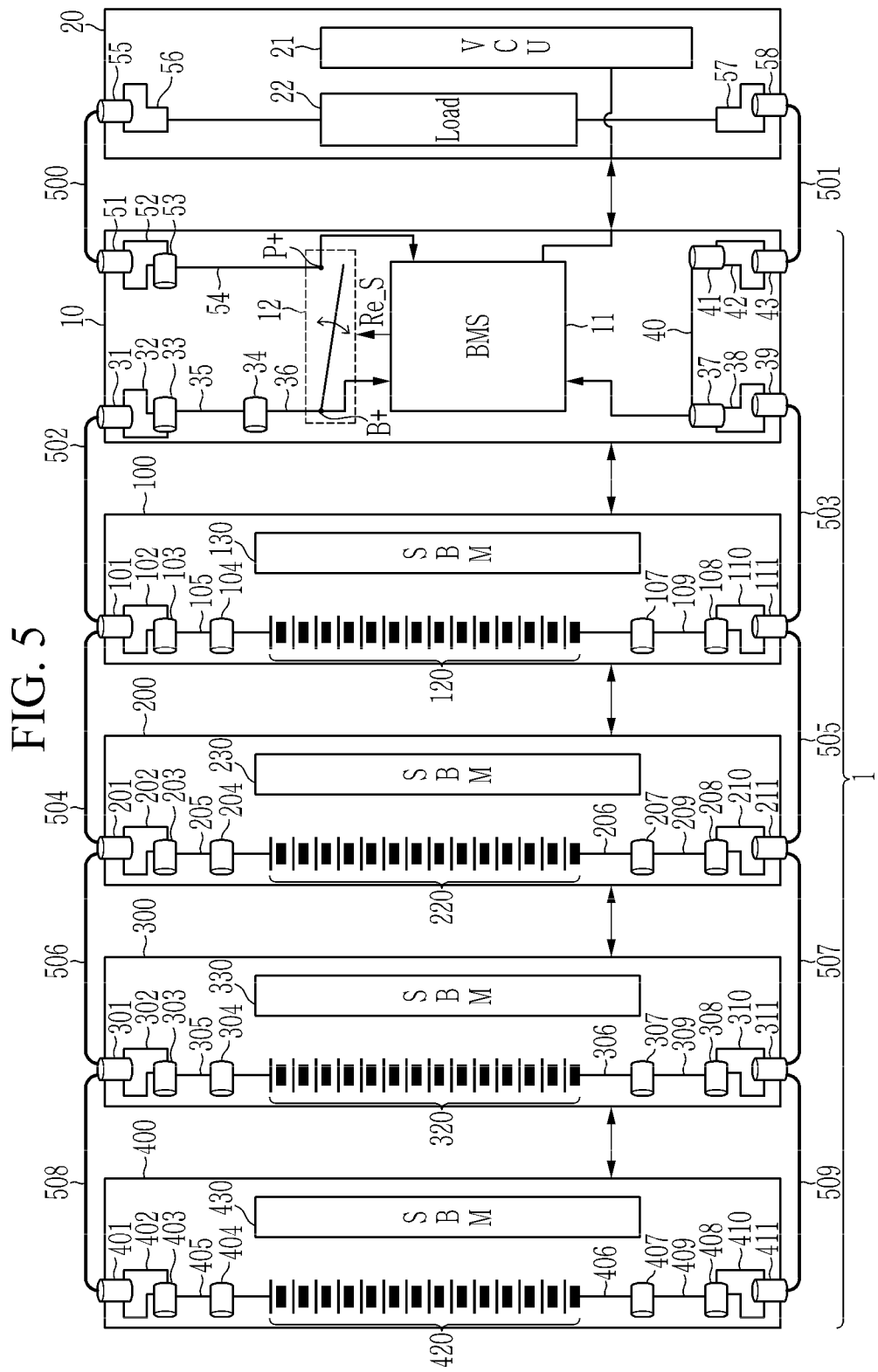
FIG. 5 is a diagram illustrating a part of configurations of a vehicle connected to a battery pack according to still another exemplary embodiment.

FIG. 5 is a diagram illustrating a part of configurations of a vehicle connected to a battery pack according to another exemplary embodiment.

As illustrated in FIG. 5, a battery pack 1 includes four battery modules 100, 200, 300, and 400. Hereinafter, overlapping descriptions to that of the foregoing exemplary embodiments will be omitted.

Positive (+) terminals 302 and 402 of the battery module 300 and the battery module 400 are coupled to one corresponding end between both ends of a wire 508 by bolts 301 and 401, and negative (−) terminals 210 and 310 of the battery module 300 and the battery module 400 are coupled to one corresponding end between both ends of a wire 509 by bolts 311 and 411.

The battery module 400 includes a plurality of serially connected cells 420 and an SBM 430. The SBM 430 may detect a current flowing in the battery module 400, a cell voltage of each of the plurality of cells 420, a temperature of the battery module 400, voltages of both ends of the battery module 400, and the like, and generate battery detection information. The SBM 430 may transmit the battery detection information to a master module 10, receive a signal from the master module 10, and generate battery detection information according to the signal received from the master module 10.

For example, when the SBM 430 receives an instruction signal instructing to detect a battery pack voltage from the master module 10, the SBM 430 measures a voltage of each of the plurality of cells 420, and then calculates the battery pack voltage by adding the measured voltage of each of the plurality of cells 320, and transmits the calculated battery pack voltage to the master module 10.

The SBM 430 may directly transceive a signal with the master module 10 or transceive a signal with the master module 10 through at least one of the three SBMs 130, 230, and 330.

Figure 6:
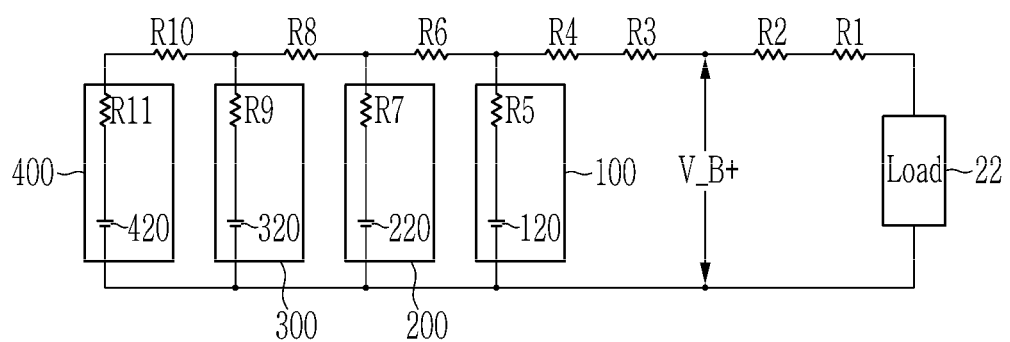
FIG. 6 is a circuit diagram illustrating an equivalent circuit of the battery pack and a load of the vehicle illustrated in FIG. 5.

FIG. 6 is a circuit diagram illustrating an equivalent circuit of the battery pack and the load of the vehicle illustrated in FIG. 5.

In FIG. 6, descriptions of resistance R1 to R9 overlap, thereby being omitted. Resistance R10 is a sum of resistance of the wires 508 and 509, and resistance R11 is a sum of resistance of the terminals 402 and 410, a fuse 409, and bus bars 405 and 406.

A scheme of calculating, by the BMS 11, a resistance sum of resistance R3 and resistance R4 is the same as that described above, so that the description thereof will be omitted.

In order to calculate block resistance representing the resistance R5 to R11, the BMS 11 uses a difference between the highest voltage and the lowest voltage in the battery pack voltages. When a current flowing in the battery pack 1 is equal to or larger than a predetermined value, the BMS 11 calculates the block resistance representing the resistance R5 to R11. Hereinafter, the current is referred to as a fourth current.

For example, the BMS 11 subtracts the lowest voltage from the highest voltage in the battery pack voltages of the four battery modules 100, 200, 300, and 400. The BMS 11 calculates the block resistance by dividing the difference between the two voltages by the fourth current, and when the calculated block resistance is equal to or larger than a predetermined fourth threshold value, the BMS 11 determines that there is abnormality in the coupling state among the wire, the bus bar, the terminal, and the fuse corresponding to the resistance R5 to R11. The third threshold value may be larger than the fourth threshold value.

Further, in still another exemplary embodiment, the BMS 11 may determine the coupling state of the wires, the terminals, the fuse, and the bus bars indicated by the resistance R5, the resistance R6, the resistance R7, the resistance R8, the resistance R9, the resistance R10, and the resistance R11 by the same principle as that of another exemplary embodiment.

By the same scheme as that described in another exemplary embodiment, the BMS 11 receives information on the voltages of both ends of the battery module from the SBMs 130, 230, 330, and 430 of the four battery modules 100, 200, 300, and 400, and compares the information with the normal range of each of the battery modules, and detects the battery module, in which the voltages of both ends of the battery module are lower than the normal range. Then, the BMS 11 may determine that there is abnormality in the coupling state of the battery module, of which the voltages of both ends are not included in the normal range.

For example, when the voltages of both ends of the battery module 400 are lower than the normal range and the voltages of both ends of the battery module 300 are within the normal range, the BMS 11 determines that the resistance R10 and the resistance R9 have larger values than that of a normal state. Then, the BMS 11 may determine that there is abnormality in the coupling state among the wires 508 and 509, the terminals 402 and 410, the bus bars 405 and 406, and the fuse 409.

When the block resistance representing the resistances R5 to R11 is equal to or larger than the fourth threshold value, the BMS 11 may compare the voltages of both ends of each of the battery modules 100, 200, 300, and 400 with the corresponding normal range and detect a point, at which the coupling state has abnormality.

When the current flowing in the battery pack 11 is equal to or larger than a predetermined value, the BMS 11 according to the exemplary embodiments performs an operation of detecting the coupling state. In the related art, there is a need for a separate synchronization signal for synchronizing an operation timing of a load of a host system, such as a vehicle, and a timing for measuring a battery pack voltage. However, according to the exemplary embodiments, a separate synchronization signal is not required, and a separate signal line for transceiving a synchronization signal is not also required.

According to the exemplary embodiments, a fastening point having abnormality in the coupling state may be detected, so that it is possible to prevent high-temperature heat and ignition due to unloosening of a screw, worn wires, and the like.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A battery pack connected to a host system, the battery pack comprising:
   a relay connected between a battery terminal of the battery pack and the host system;

at least two battery modules, each of which includes a plurality of serially connected cells and generates battery detection information; and a battery management system (BMS), which measures a voltage of the battery terminal when a current having a predetermined value or larger flows in a high current path between the battery pack and the host system, receives at least two pieces of battery detection information from the at least two battery modules, respectively, and determines a coupling state of the battery pack based on the voltage of the battery terminal and the at least two pieces of battery detection information.

2. The battery pack of claim 1, wherein:

the BMS divides a difference between a battery pack voltage based on a voltage sum of voltages of the plurality of cells of one battery module of the at least two battery modules and the voltage of the battery terminal by the current having the predetermined value or larger and calculates a resistance.

3. The battery pack of claim 2, wherein:

the one battery module of the at least two battery modules is a battery module adjacent to the BMS between the at least two battery modules, and the calculated resistance corresponds to a sum of resistances of a terminal, a bus bar, a fuse, and a wire connected between the BMS and the one battery module of the at least two battery modules.

4. The battery pack of claim 2, wherein:

when the calculated resistance has a predetermined threshold value or larger, the BMS determines that there is an abnormality in the coupling state between one battery module of the at least two battery modules and the BMS.

5. The battery pack of claim 4, wherein:

when the resistance has the predetermined threshold value or larger, the BMS determines that there is an abnormality in a coupling state between the at least two battery modules.

6. The battery pack of claim 1, wherein the BMS divides a difference between a highest voltage and a lowest voltage between at least two battery pack voltages based on a voltage sum of voltages of the plurality of serially connected cells of each battery module of the at least two battery modules by the current having the predetermined value or larger and calculates a resistance.

7. The battery pack of claim 6, wherein:

the calculated resistance corresponds to a sum of resistances of a terminal, a bus bar, and a fuse of each battery module of the at least two battery modules and a sum of resistances of wires between the at least two battery modules.

8. The battery pack of claim 1, wherein:

when battery module voltages at both ends of each battery module of the at least two battery modules are smaller than a corresponding predetermined normal range, the BMS determines that there is an abnormality in a coupling state of a battery module, which has the battery module voltage smaller than the corresponding predetermined normal range.

9. The battery pack of claim 8, wherein:

a current flowing in each battery module of the at least two battery modules is determined according to a resistance considered in said each battery module.

10. The battery pack of claim 9, wherein:

for the resistance considered in each battery module of the at least two battery modules, as a resistance value is smaller, a current flowing in a corresponding battery module increases, so that a normal range corresponding to the corresponding battery module is high, and the normal range is voltages of both ends of the battery module when there is no abnormality in a coupling state for each battery module of the at least two battery modules.

11. The battery pack of claim 10, wherein:

when the voltages of both ends of the corresponding battery module are lower than the corresponding normal range, the BMS determines that there is an abnormality in a coupling state of the corresponding battery module.

12. The battery pack of claim 10, wherein:

the normal range is different according to a resistance value considered in each battery module of the at least two battery modules.

13. The battery pack of claim 12, wherein:

as the resistance value considered in each battery module of the at least two battery modules is smaller, a corresponding normal range is high.

14. The battery pack of claim 1, wherein:

when there is an abnormality in the coupling state, the BMS switches the relay to be off and the BMS becomes off.

15. The battery pack of claim 14, wherein the BMS notifies the host system of the abnormality of the coupling state.

16. A vehicle, comprising:

a load receiving power from a battery pack; and a vehicle control unit which stops an operation of a vehicle when receiving abnormality of a coupling state from the battery pack, wherein the battery pack includes:

a relay connected between a battery terminal and the load;

at least two battery modules, each of which includes a plurality of serially connected cells and generates battery detection information; and a battery management system (BMS), which measures a voltage of the battery terminal when a current having a predetermined value or larger flows between the battery pack and the load, receives at least two pieces of battery detection information from the at least two battery modules, respectively, and determines a coupling state of the battery pack based on the voltage of the battery terminal and the at least two pieces of battery detection information.

17. The vehicle of claim 16, wherein:

the BMS divides a difference between a voltage of the battery pack based on a voltage sum of voltages of the plurality of cells of one battery module of the at least two battery modules and the voltage of the battery terminal by the current having the predetermined value or larger and calculates a resistance, and when the calculated resistance has a predetermined threshold value or larger, the BMS determines that there is abnormality in a coupling state between one battery module of the at least two battery modules and the BMS.

18. The vehicle of claim 17, wherein:

one battery module of the at least two battery modules is a battery module adjacent to the BMS between the at least two battery modules, and the calculated resistance corresponds to a sum of resistances of a terminal, a bus bar, a fuse, and a wire connected between the BMS and said one battery module.

19. The vehicle of claim 17, wherein:

the BMS divides a difference between a highest voltage and a lowest voltage between at least two battery pack voltages based on a voltage sum of voltages of the plurality of serially connected cells of each battery module of the at least two battery modules by the current having the predetermined value or larger and calculates a resistance, and when the calculated resistance has the predetermined threshold value or larger, the BMS determines that there is an abnormality in a coupling state between the at least two battery modules.

20. The vehicle of claim 19, wherein:

The calculated resistance corresponds to a sum of resistances of a terminal, a bus bar, and a fuse of each battery module of the at least two battery modules and a sum of resistances of wires between the at least two battery modules.

21. The vehicle of claim 16, wherein:

when battery module voltages at both ends of each battery module of the at least two battery modules are smaller than a corresponding predetermined normal range, the BMS determines that there is an abnormality in a coupling state of a battery module, which has the battery module voltage smaller than the corresponding predetermined normal range.

22. The vehicle of claim 21, wherein:

the corresponding predetermined normal range is different according to a resistance value considered in each battery module of the at least two battery modules.

23. The vehicle of claim 16, wherein:

when there is an abnormality in the coupling state, the BMS switches the relay to be off and the BMS becomes off.

\* \* \* \* \*